US007292953B2

(12) United States Patent
Jung

(10) Patent No.: US 7,292,953 B2
(45) Date of Patent: Nov. 6, 2007

(54) SEMICONDUCTOR MEMORY DEVICE WITH ABILITY TO ADJUST IMPEDANCE OF DATA OUTPUT DRIVER

(75) Inventor: Hun-Sam Jung, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 11/026,672

(22) Filed: Dec. 30, 2004

(65) Prior Publication Data

US 2005/0251356 A1 Nov. 10, 2005

(30) Foreign Application Priority Data

May 10, 2004 (KR) .................. 10-2004-0032845

(51) Int. Cl.
*G01R 35/00* (2006.01)
(52) U.S. Cl. ..................................... 702/107
(58) Field of Classification Search ................. 702/107
See application file for complete search history.

(56) References Cited

U.S. PATENT DOCUMENTS

| 5,764,584 | A | * | 6/1998 | Fukiage et al. ........ 365/230.03 |
| 6,807,650 | B2 | | 10/2004 | Lamb et al. |
| 6,832,177 | B2 | | 12/2004 | Khandekar et al. |
| 6,885,959 | B2 | * | 4/2005 | Salmon et al. ............... 702/107 |
| 2002/0184461 | A1 | * | 12/2002 | Zumkehr ..................... 711/167 |
| 2003/0223303 | A1 | | 12/2003 | Lamb et al. |
| 2004/0044808 | A1 | | 3/2004 | Salmon et al. |
| 2004/0083070 | A1 | | 4/2004 | Salmon et al. |
| 2004/0128429 | A1 | | 7/2004 | Khandekar et al. |
| 2005/0057981 | A1 | * | 3/2005 | Yoo ........................... 365/202 |

FOREIGN PATENT DOCUMENTS

| KR | 2003/0058733 A | 7/2003 |
| KR | 20030058722 A | 7/2003 |
| KR | 2005-0022042 | 3/2005 |
| KR | 2005-0022163 | 3/2005 |

* cited by examiner

*Primary Examiner*—Bryan Bui
*Assistant Examiner*—Jonathan Moffat
(74) *Attorney, Agent, or Firm*—Townsend and Townsend and Crew LLP

(57) ABSTRACT

A semiconductor memory device for performing an OCD calibration control operation to adjust a data output impedance includes a decoder for decoding an address signal to generate an OCD default control signal, an OCD operation signal and plural data, a code generator for receiving plural-bit data to generate an OCD control code; a first circuit for receiving the OCD control code and the OCD operation signal to generate a plurality of impedance adjustment control signals; and a second circuit for receiving the plural data and adjusting the data output impedance in response to the plurality of impedance adjustment control signals.

17 Claims, 19 Drawing Sheets

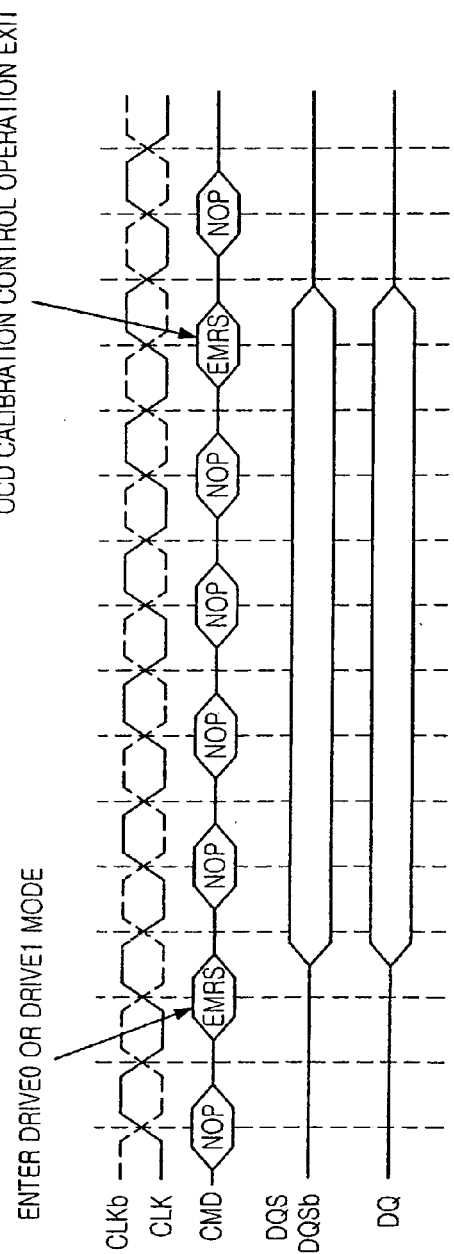

SEMICONDUCTOR MEMORY DEVICE WITH ABILITY TO ADJUST IMPEDANCE OF DATA OUTPUT DRIVER

BACKGROUND OF THE INVENTION

1. Field of Invention

The present invention relates to a semiconductor memory device; and, more particularly, to a semiconductor memory device capable of adjusting the impedance of a data output driver.

2. Description of Prior Art

Dynamic random access memory (DRAM) has been improved continuously to increase its operational speed. Synchronizing an internal clock signal with an external clock signal is one of the methods used to improve an operational speed of the DRAM. A DRAM which is operated in synchronization with the external clock signal is called a synchronous dynamic random access memory (SDRAM). The SDRAM performs a data access operation at a rising edge of the external clock signal. Thus, the SDRAM can perform data access operations once per cycle of the external clock signal. An SDRAM that performs data access operations once per external clock signal is often referred to as a single data rate (SDR) SDRAM.

The SDR SDRAM has been improved for use in a high speed system. The double data rate (DDR) SDRAM performs data access operations at both a rising edge and a falling edge of the external clock signal. In other words, the DDR SDRAM performs data access operations twice per external clock signal. A double data rate 2 (DDR2) SDRAM is an upgraded version of the DDR SDRAM.

For enhancing operational speed of the DDR2 SDRAM, new concepts have been described by an international electronics standardization organization, namely the Joint Electron Device Engineering Council (JEDEC). An off chip driver (OCD) calibration control is one such new concept. The OCD calibration control allows adjusting the impedance of a data output driver to an optimum value. The optimum impedance of the data output driver can be found by measuring a current flow from an external device, such as a chipset, to the data output driver, or a voltage between the chipset and the data output driver.

FIG. 1 is a block diagram showing a data interface between a chipset and a conventional DDR SDRAM. The data interface shown in FIG. 1 illustrates how data access operations are performed. As shown, the DDR SDRAM receives a plurality of command signals such as a chip selection bar signal/CS, a write enable bar signal/WE, a clock signal CLK and a clock bar signal/CLK from the chipset. The conventional DDR SDRAM also receives a plurality of address signals A0 to A15. In addition, the conventional DDR SDRAM receives or outputs data through a plurality of data output pins DQ0 to DQ15.

The DDR SDRAM receives a data strobe signal DQS through a data strobe input pin DQS. The data strobe signal DQS periodically changes its logic level while the data access operation is performed. The DDR SDRAM generally uses the data strobe signal DQS for aligning and transfers the aligned data to the inside of the DDR SDRAM.

FIG. 2 is a flow chart showing an operational procedure of performing an OCD calibration control operation introduced by the JEDEC. Each step of the operational procedure is marked by step numbers from 10 to 21. The operational procedure can be considered as having two sequences—a first sequence for measuring impedance of the data output driver and a second sequence for adjusting the impedance.

The data output driver includes a pull-up driver and a pull-down driver, and activates one of those drivers to output data. That is, the data output driver outputs data having a logic high level through the pull-up driver and outputs a data having a logic low level through the pull-down driver. Therefore, the impedance of the data output driver can be measured by measuring the impedance of the pull-up driver or the impedance of the pull-down driver. In a first drive mode DRIVE1, the impedance of the pull-up driver is measured and, in a second drive mode DRIVE0, the impedance of the pull-down driver is measured.

The operational sequence of performing the OCD calibration control operation is described below referring to FIG. 2. If a drive mode is set to the first drive mode DRIVE1 by an extended mode register set (EMRS), data signals outputted through all data pins (DQ pins) and the data strobe signal DQS become a logic high level, and the data strobe bar signal/DQS becomes a logic low level as shown in the step 10. Various operations of a DDR SDRAM are controlled based on a value set in the EMRS. Herein, in the first drive mode DRIVE1, the impedance of the data output driver is measured when the pull-up driver outputs the data as a logic high level.

Then, the chipset measures the impedance of the pull-up driver. If the measured impedance of the pull-up driver is an optimum value for a current system status, the EMRS is set as a termination of the OCD calibration control operation, as shown in the steps 11 and 15. After the step 15, the OCD calibration control operation is performed again, i.e., the EMRS is set as the second drive mode DRIVE0 as shown in the step 16. Otherwise, if the measured impedance of the pull-up driver is not the optimum value for the current system status, the EMRS is set as an adjustment mode for adjusting the measured impedance of the pull-up driver as shown in the steps 11 and 12.

In the adjustment mode, referring to the steps 13 and 14, the output impedance of the pull-up driver is increased or decreased by decoding a burst code to thereby adjust the impedance of the pull-up driver. The burst code is outputted by the chipset and a burst length (BL) is set to 4. In the adjustment mode, the output impedance of the pull-up driver is adjusted by controlling the number of turned-on pull-up MOS transistors included in the pull-up driver. The pull-up MOS transistors are connected in parallel and, also, each of the pull-up MOS transistors has a same driving strength.

Thereafter, the OCD calibration control operation is terminated based on the EMRS as shown in the step 14. Then, the OCD calibration control operation is performed again, i.e., the EMRS is set as the first drive mode DRIVE1 for measuring the impedance of the pull-up driver again as shown in the step 10.

If the impedance of the pull-up driver is not the optimum value, the impedance of the pull-up driver is adjusted by the same way, i.e., the steps 12 to 14, described above until the measured impedance is considered as the optimum value. If the impedance of the pull-up driver is the optimum value, the drive mode, i.e., a value set in the EMRS, is set to the second drive mode DRIVE0 as described above at the step 16. In the second drive mode DRIVE0, the impedance of the data output driver is measured when the pull-down driver outputs the data having a logic low level to the chipset. That is, the chipset measures the impedance of the pull-down driver. If the measured impedance of the pull-down driver is an optimum value for the current system status, the OCD calibration control operation is terminated as shown in the steps 17 and 21.

On the other hand, if the measured impedance of the pull-down driver is not the optimum value for the current system status, the EMRS sets the adjustment mode for adjusting the measured impedance of the pull-down driver as shown in the step 18. Then, the steps 19, 20, 16 and 17 are sequentially performed until the measured impedance of the pull-down driver becomes the optimum value. If the measured impedance of the pull-down driver becomes the optimum value as a result of the step 17, the OCD calibration control operation is terminated at the step 21.

FIG. 3A is a timing diagram showing the operation of measuring the impedance of the data output driver while the OCD calibration control operation is performed. FIG. 3B is an operation table showing an operation of performing the OCD calibration control operation in response to a 3-bit control signal inputted through address pins A7, A8 and A9. The operation for measuring the output impedance of the data output driver is described in detail referring to FIGS. 3A and 3B.

First, the chipset inputs the 3-bit control signal to a DDR2 SDRAM so that the EMRS can set the drive mode to one of the first drive mode DRIVE1 and the second driver mode DRIVE0. The 3-bit control signal is inputted to the address pins A7 to A9. The OCD calibration control operation according to the 3-bit control signal is defined in the operation table shown in FIG. 3B. For example, if the 3-bit control signal is 100 or 010, the EMRS sets the drive mode to the first drive mode DRIVE1 or the second drive mode DRIVE0 respectively. After that, if the 3-bit control signal is 001, the EMRS sets the adjustment mode. In addition, if the 3-bit control signal is 111, the impedance of the data output driver is set to a default impedance value.

In the first drive mode DRIVE1, the data output driver outputs the data as a logic high level through the pull-up driver and the impedance of the pull-up driver is measured. In the second drive mode DRIVE0, the data output driver outputs the data as a logic low level through the pull-down driver and the impedance of the pull-down driver is measured. The 'EMRS' shown in FIG. 3A indicates a timing of setting the EMRS and the 'NOP' means no-operation.

FIG. 4A is a timing diagram showing an operation of adjusting the impedance of the data output driver while the OCD calibration control operation is performed. FIG. 4B is an operation table showing the OCD calibration control operation according to the burst code. The operation of adjusting the impedance of the data output driver is described in detail referring to FIGS. 4A and 4B.

If the EMRS sets the adjustment mode, the chipset inputs the 4-bit burst code to the conventional DDR SDRAM through the DQ pins. The operation table shown in FIG. 4B shows the operation in the adjustment mode according to the 4-bit burst code. The operation in the adjust mode is performed by turning on/off MOS transistors included in the data output driver as described above. For example, if the burst code is inputted as '1000' once, one of activated pull-down MOS transistors included in the pull-down driver is turned-off. If the burst code is inputted as '1001', the number of activated pull-up MOS transistors included in the pull-up driver is increased by one and the number of activated pull-down MOS transistors included in the pull-down driver is decreased by one. After the adjustment mode is completed, i.e., the 3-bit control signal is inputted as '000', the OCD calibration control operation is finished.

The above-described OCD calibration control operation is a newly introduced concept by the JEDEC and a circuit for performing the OCD calibration control operations has not been developed yet. Therefore, an electronic circuit capable of performing the OCD calibration control operation is desired for a DDR2 SDRAM.

BRIEF SUMMARY OF THE INVENTION

This invention provides a semiconductor memory device having a circuit for adjusting the impedance of a data output driver. In accordance with an aspect of the present invention, there is provided a semiconductor memory device for performing an OCD calibration control operation to adjust a data output impedance. The device includes means for decoding an address signal to generate an OCD default control signal, an OCD operation signal and plural data; means for receiving a plural-bit data to generate an OCD control code; means for receiving the OCD control code and the OCD operation signal to generate a plurality of impedance adjustment control signals; and means for receiving the plural data and adjusting the data output impedance in response to the plurality of impedance adjustment control signals.

BRIEF DESCRIPTION OF THE DRAWINGS

The above and other objects and features of the present invention will become apparent from the following description of preferred embodiments taken in conjunction with the accompanying drawings, in which:

FIG. 3A is a timing diagram showing an operation of measuring the impedance of the data output driver while the OCD calibration control operation is performed;

FIG. 3B is an operation table showing an operation of performing the OCD calibration control operation;

DETAILED DESCRIPTION OF THE INVENTION

A semiconductor memory device in accordance with the present invention will be described in detail referring to the accompanying drawings.

Figure 1:
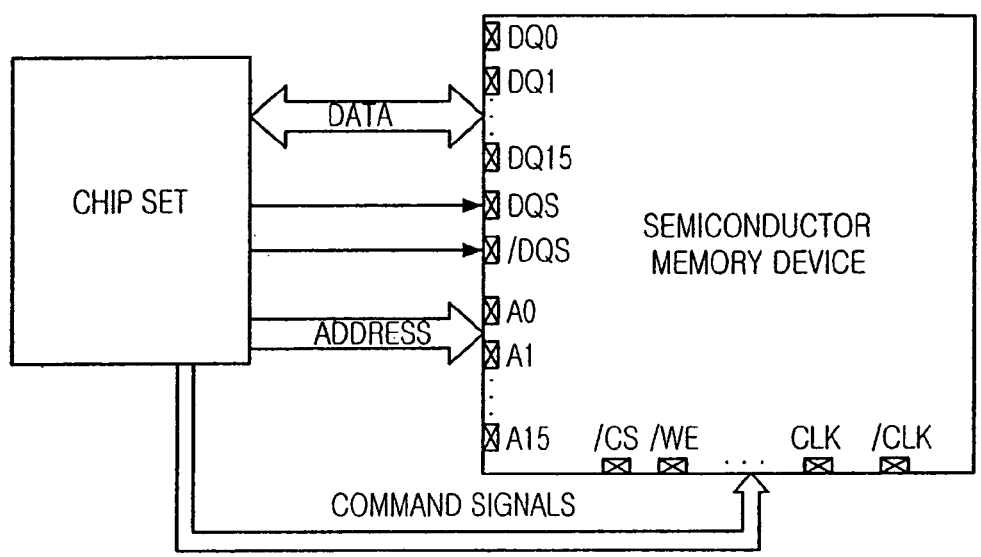
FIG. 1 is a block diagram showing a data interface between a chipset and a conventional DDR SDRAM.
Figure 2:
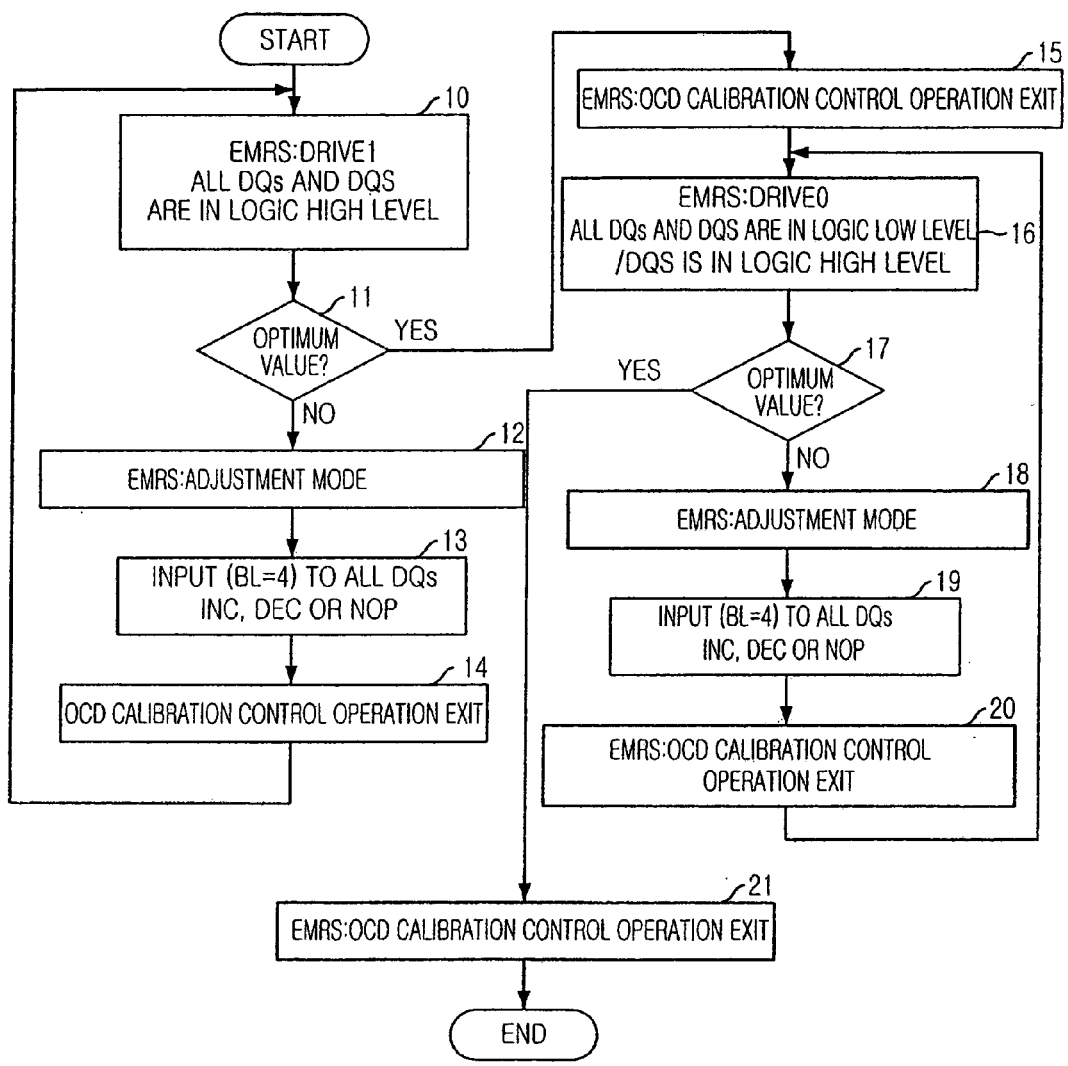
FIG. 2 is a flow chart showing an operational procedure of performing an OCD calibration control operation introduced by the JEDEC.
Figures 4A, 4B:
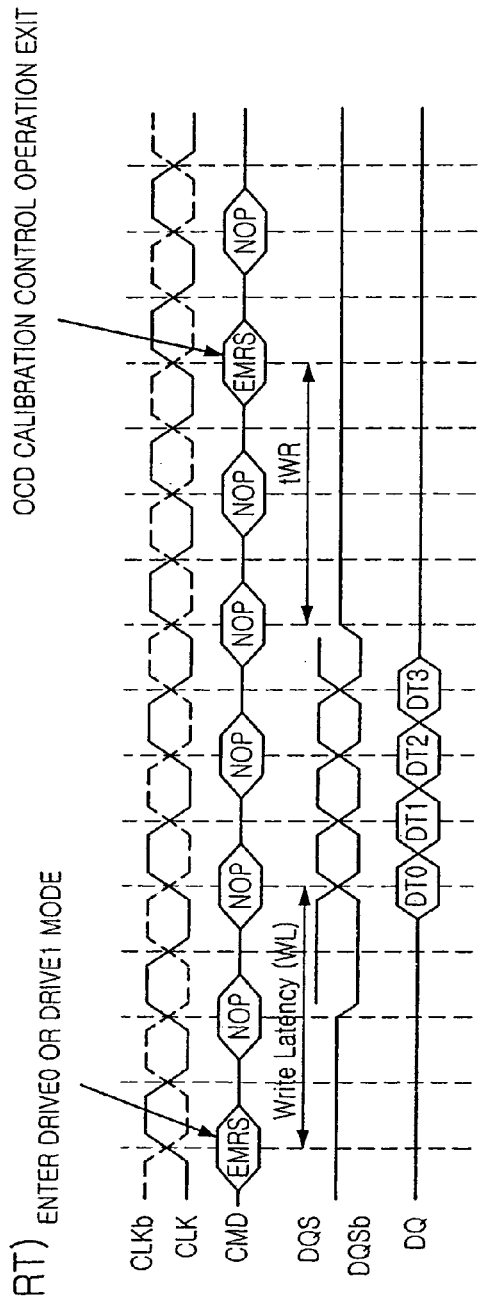
FIG. 4A is a timing diagram showing an operation of adjusting the impedance of the data output driver while the OCD calibration control operation is performed.
FIG. 4B is an operation table showing the OCD calibration control operation according to a burst code.
Figure 5:
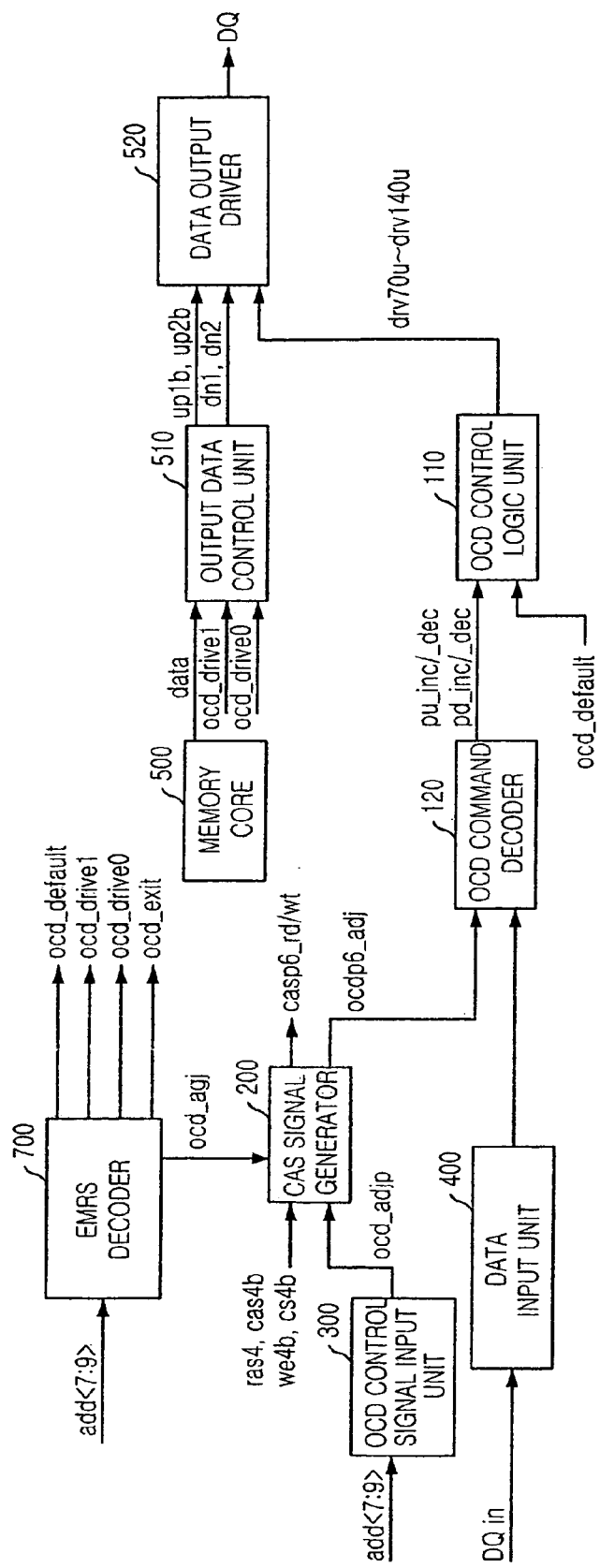
FIG. 5 is a block diagram showing a semiconductor memory device in accordance with the present invention.

FIG. 5 is a block diagram showing a semiconductor memory device in accordance with the present invention. As shown, the synchronous semiconductor memory device includes an extended mode register set (EMRS) decoder 700, a column address strobe (CAS) signal generator 200, an off chip driver (OCD) control signal input unit 300, a data input unit 400, an OCD command decoder 120, an OCD control logic unit 110, a memory core block 500, an output data control unit 510 and a data output driver unit 520.

The data input unit 400 latches and aligns plural data inputted through a data input/output pad during a data access operation and the data input unit 400 latches and aligns an OCD control code inputted through the data input/output pad during an OCD calibration control operation. The data output driver 520 outputs plural data transferred from the memory core block 500 to the data input/output pad.

The OCD command decoder 120 decodes the OCD control code outputted from the data input unit 400 in order to generate a pull-up increase signal pu_inc, a pull-up decrease signal pu_dec, a pull-down increase signal pd_inc and a pull-down decrease signal pd_dec. The OCD control logic unit 110 controls an impedance of the data output driver 520 based on the pull-up increase signal pu_inc, the pull-up decrease signal pu_dec, the pull-down increase signal pd_inc and the pull-down decrease signal pd_dec outputted from the OCD command decoder 120.

The CAS signal generator 200 generates a first and a second CAS signal casp6_rd and casp6_wt for transferring aligned data outputted from the data input unit 400 to the memory core block 500 during the data access operation, or generates an OCD operation signal ocdp6_adj for controlling the OCD command decoder 120 during the OCD calibration control operation.

The output data control unit 510 transfers the data outputted from the memory core block 500 to the data output driver 520 or makes the data output driver 520 output the plural data having one of a logic high level and a logic low level unconditionally during the OCD calibration control operation.

The OCD control signal input unit 300 receives an OCD control signal through a 3-bit address pin add<7:9> for generating an OCD mode entrance signal ocd_adjp. The CAS signal generator 200 generates the OCD operation signal ocdp6_adj based on the OCD mode entrance signal ocd_adjp.

The EMRS decoder 700 receives the OCD control signal through the 3-bit address pin add<7:9> in order to generate an OCD default control signal ocd_default, a first drive mode signal ocd_drive1, a second drive mode signal ocd_drive0, an OCD exit signal ocd_exit and an OCD period signal ocd_adj for controlling the output data control unit 510, the OCD control logic unit 110 and the OCD command decoder 120.

Figure 6:
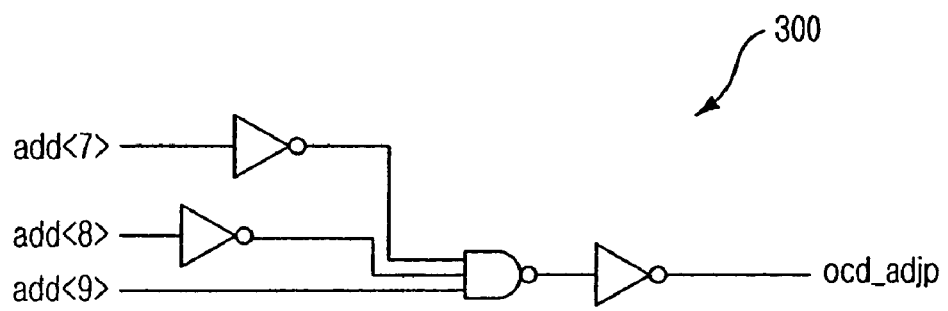
FIG. 6 is a schematic circuit diagram showing an OCD control signal input unit.

FIG. 6 is a schematic circuit diagram showing the OCD control signal input unit 300. As shown, the OCD control signal input unit 300 includes a plurality of inverters and a NAND gate. If the OCD control signal is inputted having a value of '001' through the 3-bit address pin add<7:9>, the OCD mode entrance signal ocd_adjp is activated as a logic high level so that the OCD calibration control operation is performed. On the other hand, the OCD control signal is inputted having another digital value except for '001' through the 3-bit address pin add<7:9> during the data access operation.

Figure 7:
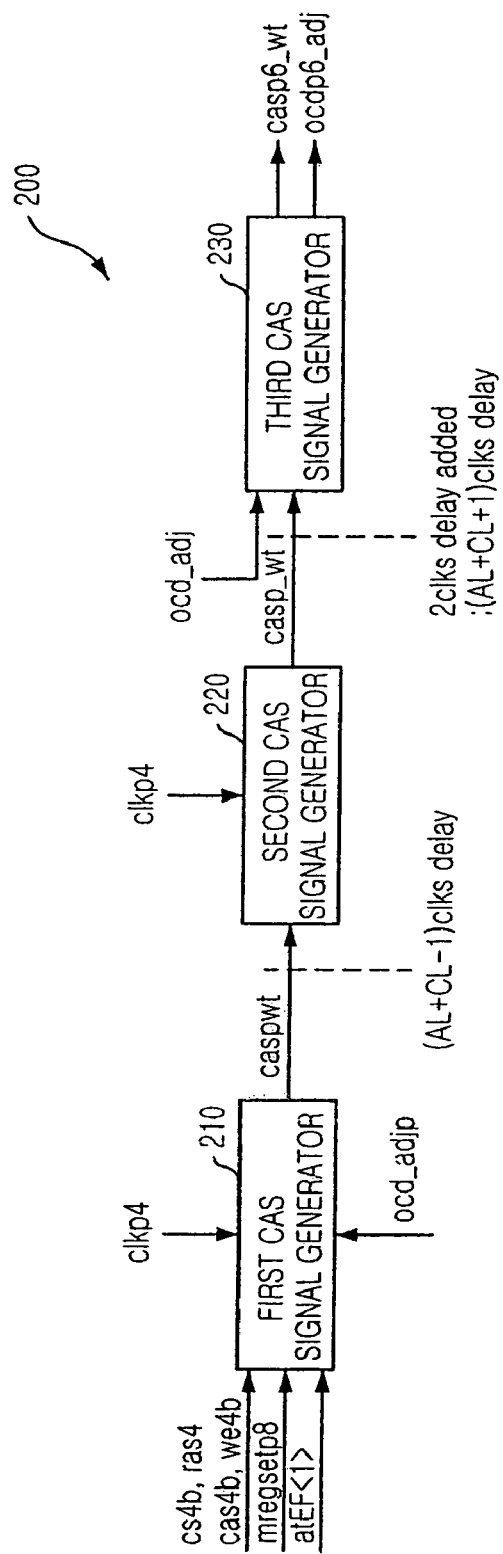
FIG. 7 is a block diagram showing a CAS signal generator shown in FIG. 5.

FIG. 7 is a block diagram showing the CAS signal generator 200 shown in FIG. 5. As shown, the CAS signal generator 200 includes a first CAS signal generator 210, a second CAS signal generator 220 and a third CAS signal generator 230. The first CAS signal generator 210 is enabled by the OCD mode entrance signal ocd_adjp and generates a first step CAS signal caspwt in response to a clock signal clkp4. The second CAS signal generator 220 generates a second step CAS signal casp_wt by delaying the first step CAS signal caspwt for two clock cycles. The third CAS signal generator 230 outputs the second step CAS signal casp_wt as the first CAS signal casp6_wt or the OCD operation signal ocdp6_adj in response to the OCD period signal ocd_adj.

Figure 8A:
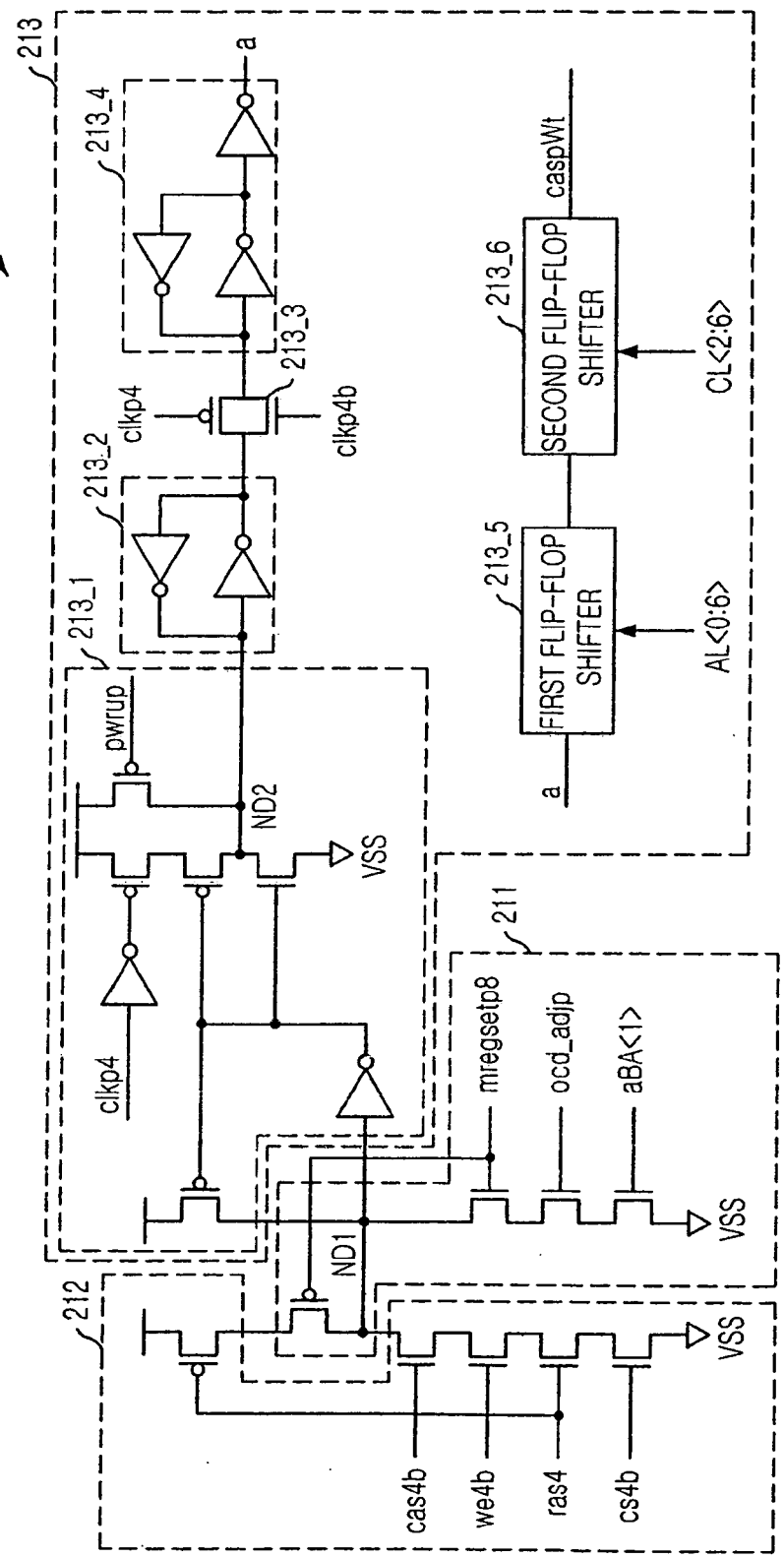
FIG. 8A is a schematic circuit diagram showing a first CAS signal generator shown in FIG. 7.

FIG. 8A is a schematic circuit diagram showing the first CAS signal generator 210 shown in FIG. 7. As shown, the first CAS signal generator 210 includes a write control signal input unit 212 for activating an output signal of a first node ND1 in response to a plurality of write command signals cas4b, we4b, ras4 and cs4b; an OCD mode entrance signal input unit 211 for activating the output signal of the first node ND1 during the OCD calibration control operation; and a CAS signal transferring unit 213 for outputting the output signal of the first node ND1 as the first step CAS signal caspwt to the second CAS signal generator 220 based on the clock signal clkp4, an additive latency signal AL<0:6> and a CAS latency signal CL<0:6> when the output signal of the first node ND1 is activated.

The CAS signal transferring unit 213 includes a signal transferring unit 213_1, a first latch unit 213_2, a first transferring gate 213_3, a second latch unit 213_4, a first flip-flop shifter 213_5 and a second flip-flop shifter 213_6. The signal transferring unit 213_1 transfers the output signal of the first node ND1 to a second node ND2 in response to the clock signal clkp4 when the output signal of the first node ND1 is activated. The first latch unit 213_2 latches the signal transferred to the second node ND2 by the signal transferring unit 213_1.

The first transferring gate 213_3 transfers the signal latched by the first latch unit 213_2 to the second latch unit 213_4 in response to the clock signal clkp4. Then, the second latch unit 213_4 latches the signal transferred by the first transferring gate 213_3. The first flip-flop shifter 213_5 transfers the signal latched by the second latch unit 213_4 to the second flip-flop shifter 213_6 in response to the additive latency signal AL<0:6>. The second flip-flop shifter 213_6 outputs the signal received from the first flip-flop shifter 213_5 as the first step CAS signal caspwt in response to the CAS latency signal CL<0:6>.

The additive latency is a time period between a timing when a read/write command signal is inputted and a timing when the read/write command signal is performed. The CAS latency is a time period between a timing when the read/ write command signal is performed and a timing when the data is outputted in response to the read/write command signal.

Meanwhile, the first CAS signal generator 210 generates the first step CAS signal caspwt so that the CAS signal casp6_wt or the OCD operation signal ocdp6_adj can be generated based on the first step CAS signal caspwt. Particularly, in case that the first step CAS signal caspwt is generated for generating the OCD operation signal ocdp6_adj, the OCD mode entrance signal input unit 211 serves to control the first step CAS signal caspwt.

The OCD mode entrance signal input unit 211 sets the first node ND1 to a logic low level if all of the OCD mode entrance signal ocd_adjp, a pulse signal mregsetp8 and a decoded bank address aBA<1> are a logic high level. Therefore, the first CAS signal generator 210 outputs the first step CAS signal caspwt as a logic high level.

The OCD mode entrance signal ocd_adjp is activated if a 3-bit control code having a logic value of '001' is inputted through the 3-bit address pin add<7:9>. The pulse signal mregsetp8 is activated based on a value of the EMRS or a mode register set (MRS). The decoded bank address signal aBA<1> is used for distinguishing between the EMRS and the MRS. The MRS has the same structure with the EMRS; however, operations of a semiconductor memory device controlled by the MRS are different from those of the EMRS.

Figure 8B:
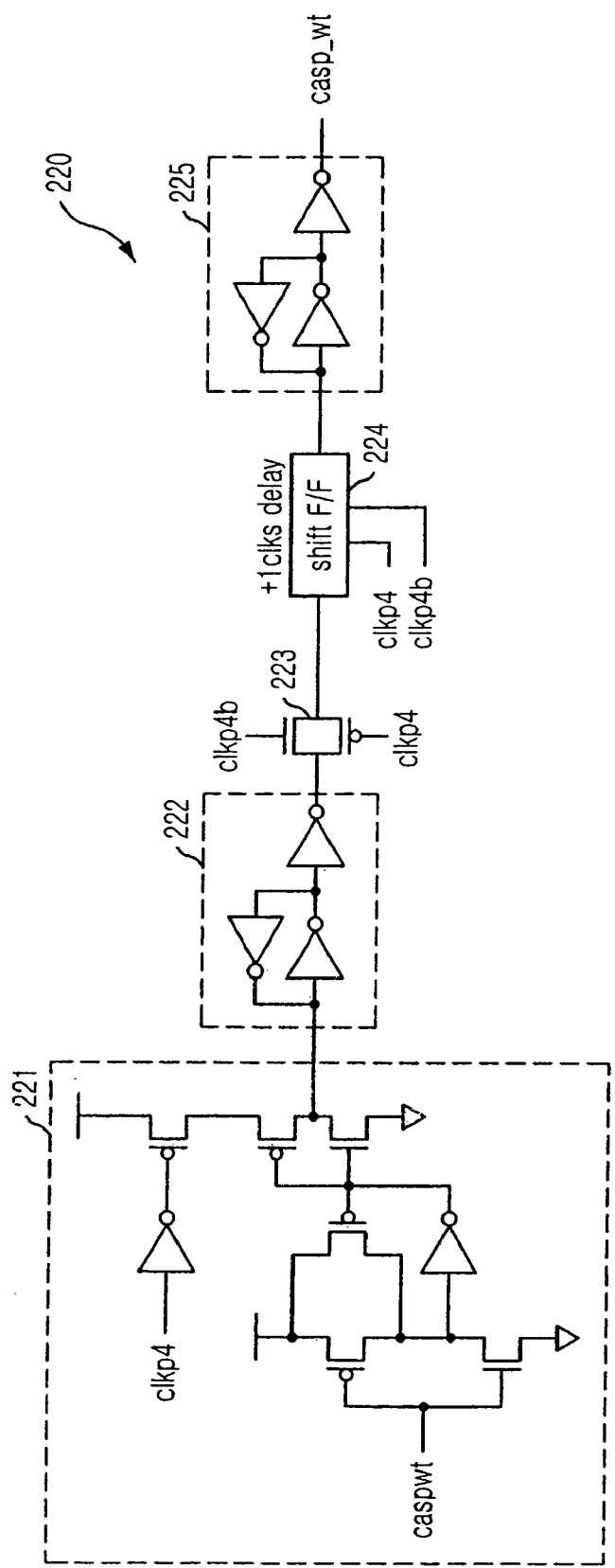
FIG. 8B is a schematic circuit diagram showing a second CAS signal generator shown in FIG. 7.

FIG. 8B is a schematic circuit diagram showing the second CAS signal generator 220 shown in FIG. 7. As shown, the second CAS signal generator 220 includes a first step CAS signal input unit 221, a third latch unit 222, a second transferring gate 223, a delay unit 224 and a fourth latch unit 225.

The first step CAS signal input unit 221 receives the first step CAS signal caspwt outputted from the first CAS signal generator 200. The third latch unit 222 latches an output signal of the first step CAS signal input unit 221 and the second transferring gate 223 transfers the latched signal of the third latch unit 222 to the delay unit 224. The delay unit 224 delays an output signal of the second transferring gate 223 for a predetermined delay time, i.e., for a clock cycle of the clock signal clkp4. The fourth latch unit 225 latches an output signal of the delay unit 224 in order to output latched signal as the second step CAS signal casp_wt.

Figure 8C:
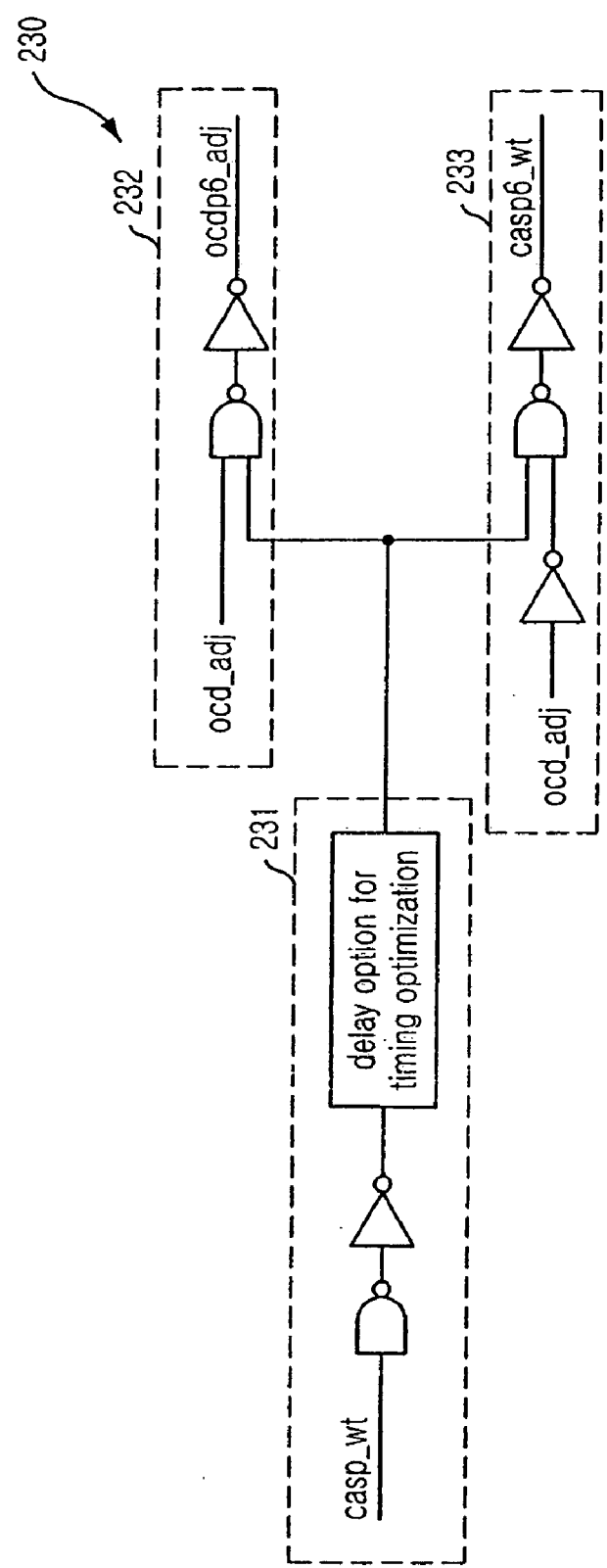
FIG. 8C is a schematic circuit diagram showing the third CAS singal generator shown in FIG. 7.

FIG. 8C is a schematic circuit diagram showing the third CAS signal generator 230 shown in FIG. 7. As shown, the third CAS signal generator 230 includes a second step CAS signal input unit 231, a first signal output unit 232 and a second signal output unit 233.

The second step CAS signal input unit 231 receives the second step CAS signal casp_wt. The first signal output unit 232 receives an output signal of the second step CAS signal input unit 231 and the OCD period signal ocd_adj in order to output the output signal of the second step CAS signal input unit 231 as the OCD operation signal ocdp6_adj when the OCD period signal ocd_adj is a logic high level.

Similarly, the second signal output unit 233 receives the output signal of the second step CAS signal input unit 231 and the OCD period signal ocd_adj in order to output the output signal of the second step CAS signal input unit 231 as the CAS signal casp6_wt when the OCD period signal ocd_adj is in a logic low level.

That is, the third CAS signal generator 230 outputs the OCD operation signal ocdp6_adj or the CAS signal casp6_wt based on the OCD period signal ocd_adj after receiving the second step CAS signal casp_wt. The OCD period signal ocd_adj is activated based on the EMRS, and a logic level of the OCD period signal ocd_adj is not changed until the EMRS is reset. That is, like the CAS latency or a burst length (BL) whose value is not changed if the EMRS is set, the OCD period signal ocd_adj keeps its logic value while the EMRS is set.

The OCD period signal ocd_adj is activated during the OCD calibration control operation, and becomes inactivated if the OCD calibration control operation is terminated. That is, the OCD period signal ocd_adj is activated only when the OCD calibration control operation is performed. The OCD period signal ocd_adj is inactivated during the data access operation. The third CAS signal generator 230 activates the OCD operation signal ocdp6_adj as a logic high pulse when the OCD period signal ocd_adj is a logic high level, or activates the CAS signal casp6_wt when the OCD period signal ocd_adj is a logic low level.

Figure 9:
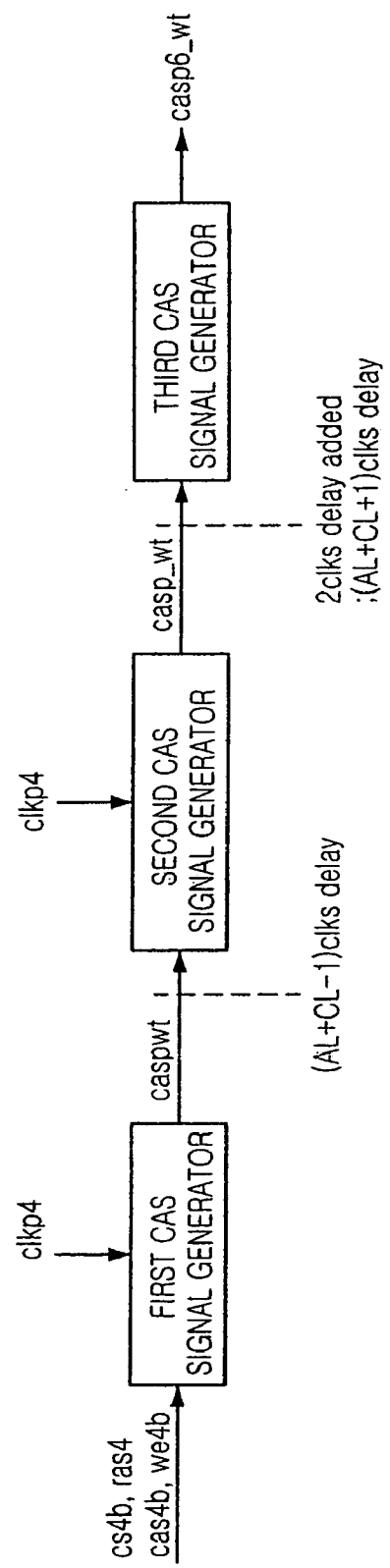
FIG. 9 is a block diagram showing a conventional CAS signal generator included in a conventional semiconductor memory device.

FIG. 9 is a block diagram showing a CAS signal generator included in a conventional semiconductor memory device. As shown, the CAS signal generator includes a first to a third CAS signal generators. Since the CAS signal generator is conventionally used and well known to those skilled in the art, detailed descriptions for the CAS signal generators are omitted.

Figure 10:
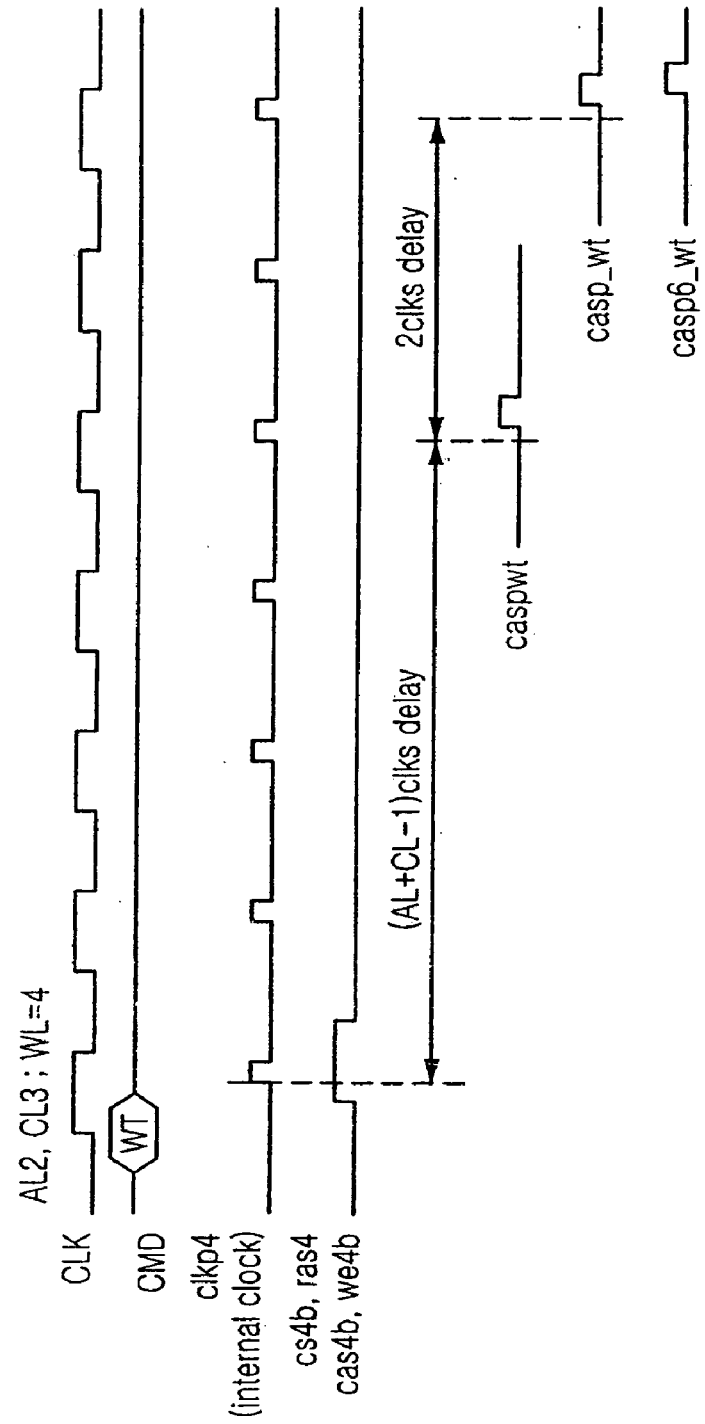
FIG. 10 a timing diagram showing an operation of a conventional CAS signal generator shown in FIG. 9.

FIG. 10 is a timing diagram showing an operation of the CAS signal generator shown in FIG. 9. If a write command signal WT is inputted, a 4-bit data is sequentially inputted after a delay time of (AL+CL−1) is passed from the inputting timing of the write command signal WT. Then, the 4-bit data is aligned after a delay time of two clock cycles, and the aligned 4-bit data is inputted to a memory core block. The CAS signal casp6_wt is used for a reference signal indicating a timing of inputting the aligned 4-bit data to the memory core block.

In addition, when the write command signal is inputted, the first step CAS signal caspwt is generated after the delay time of (AL+CL−1) is passed from the inputting timing of the write command signal WT. Then, the second step CAS signal casp_wt is generated by delaying the first step CAS signal caspwt for the delay time of two clock cycles. The CAS signal casp6_wt is generated by adjusting the second step CAS signal casp_wt.

The CAS signal generator 200 in accordance with the present invention has the same timing diagram shown in FIG. 10. However, the CAS signal generator 200 can further generate the OCD operation signal ocdp6_adj for the OCD calibration control operation. This operation is described in FIG. 13.

Figure 11:
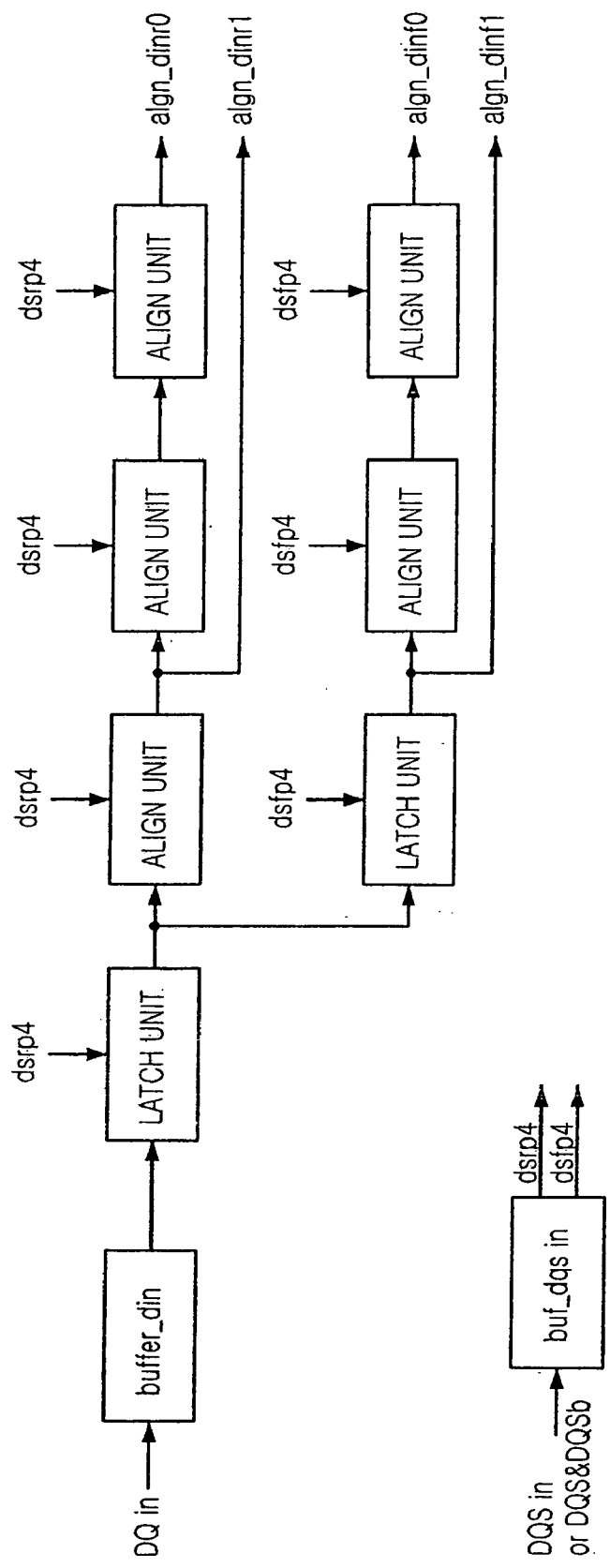
FIG. 11 is a block diagram showing a data input unit shown in FIG. 5.

FIG. 11 is a block diagram showing the data input unit 400 shown in FIG. 5. As shown, the data input unit 400 includes a plurality of align units for aligning inputted data. Each align unit performs the aligning operation in response to a first and a second aligning control signals dsrp4 and dsfp4 generated from the data strobe signal DQS. The aligned data is outputted as plural single-bit data algn_dinr0, algn_dinr1, algn_dinf0 and algn_dinf1.

Figure 12:
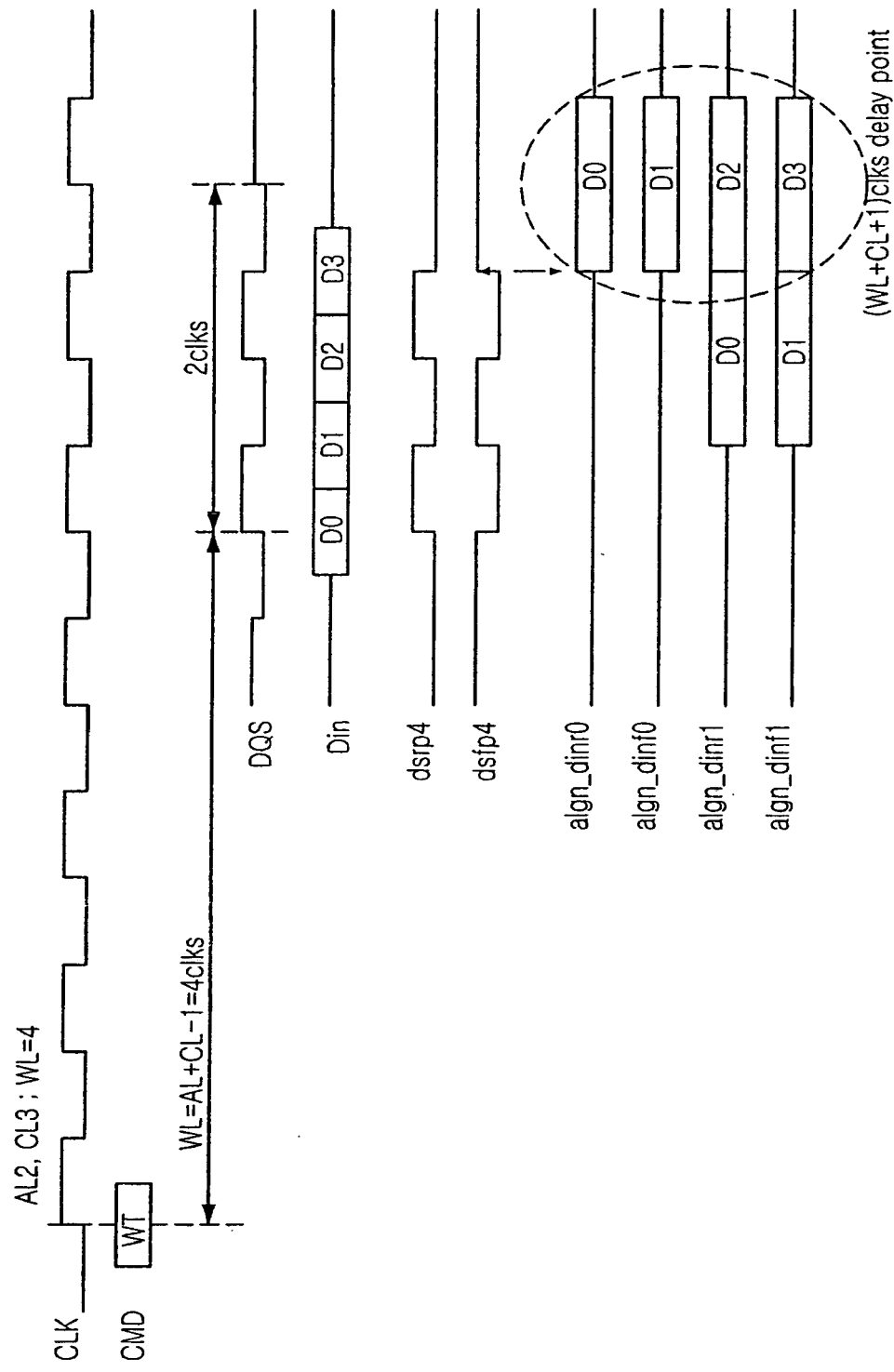
FIG. 12 is a timing diagram showing an operation of a data input unit shown in FIG. 5.

FIG. 12 is a timing diagram showing an operation of the data input unit 400. The OCD control code is aligned at the same time when the data is aligned in the data input unit 400. Therefore, the OCD operation signal ocdp6_adj is generated at the same time when the CAS signal casp6_wt is generated.

Figure 13:
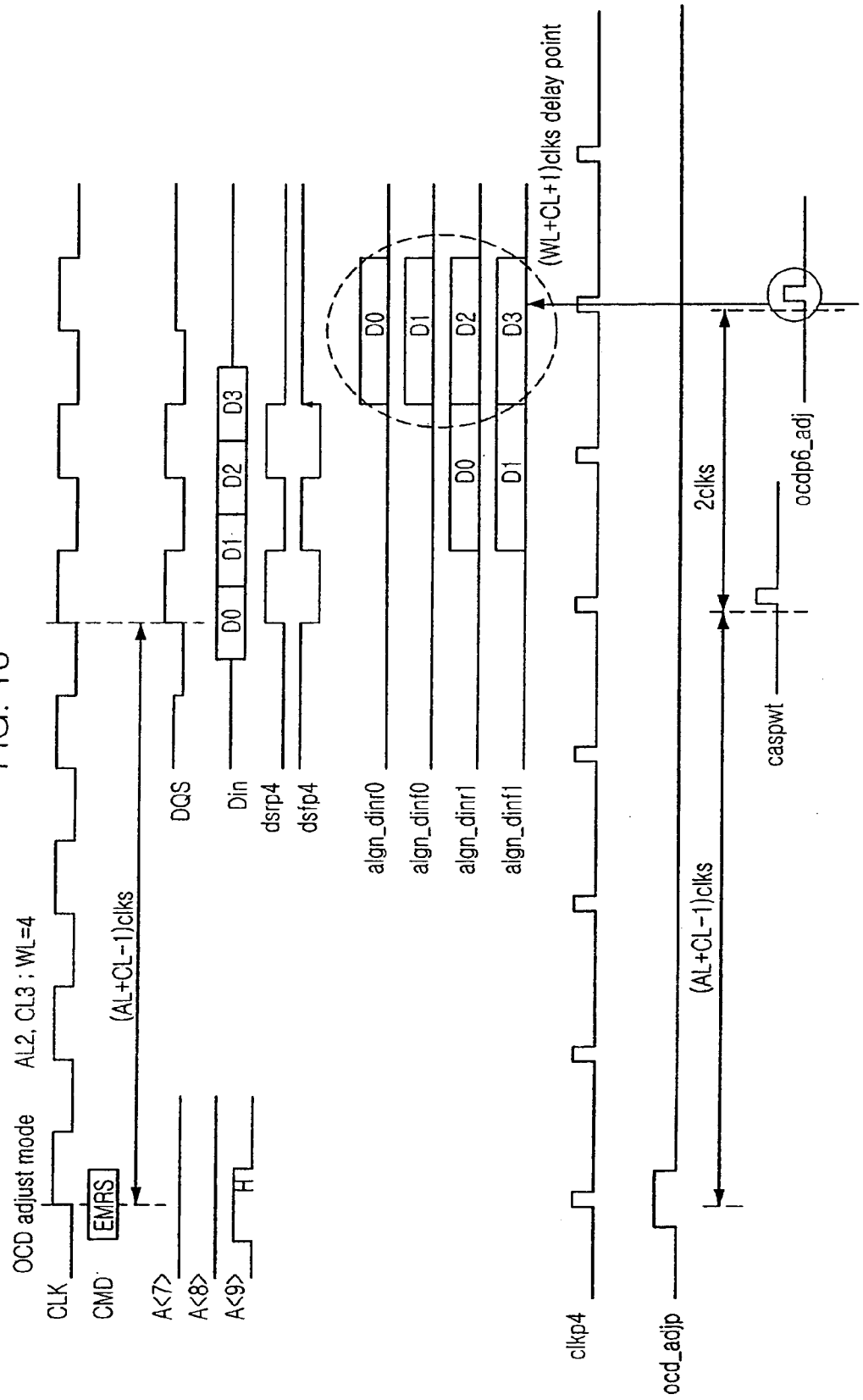
FIG. 13 is a timing diagram showing a CAS signal generator shown in FIG. 7.

FIG. 13 is a timing diagram showing the CAS signal generator 200 shown in FIG. 7. As shown, the OCD operation signal ocdp6_adj is generated at the timing when the data is aligned in the data input unit 400. The first CAS signal generator 210 generates the first step CAS signal caspwt after the delay time of (AL+CL−1) if the OCD mode entrance signal ocd_adjp is activated.

Thereafter, the second CAS signal generator 220 generates the second step CAS signal casp_wt by delaying the first step CAS signal caspwt for the delay time of two clock cycles. Then, the third CAS signal generator 230 output the second step CAS signal casp_wt as the OCD operation signal ocdp6_adj in response to the OCD period signal ocd_adj. The delay time of two clock cycles is a required time for aligning the 4-bit data inputted to the data input unit 400.

If the OCD operation signal ocdp6_adj is generated, the OCD command decoder 120 decodes the OCD control code which is aligned by the data input unit 400. As a result, the OCD command decoder 120 generates the pull-up increase signal pu_inc, the pull-up decrease signal pu_dec, the pull-down increase signal pd_inc and the pull-down decrease signal pd_dec. The OCD control logic unit controls the impedance of the data output driver 520 based on the pull-up increase signal pu_inc, the pull-up decrease signal pu_dec, the pull-down increase signal pd_inc and the pull-down decrease signal pd_dec.

Figure 14:
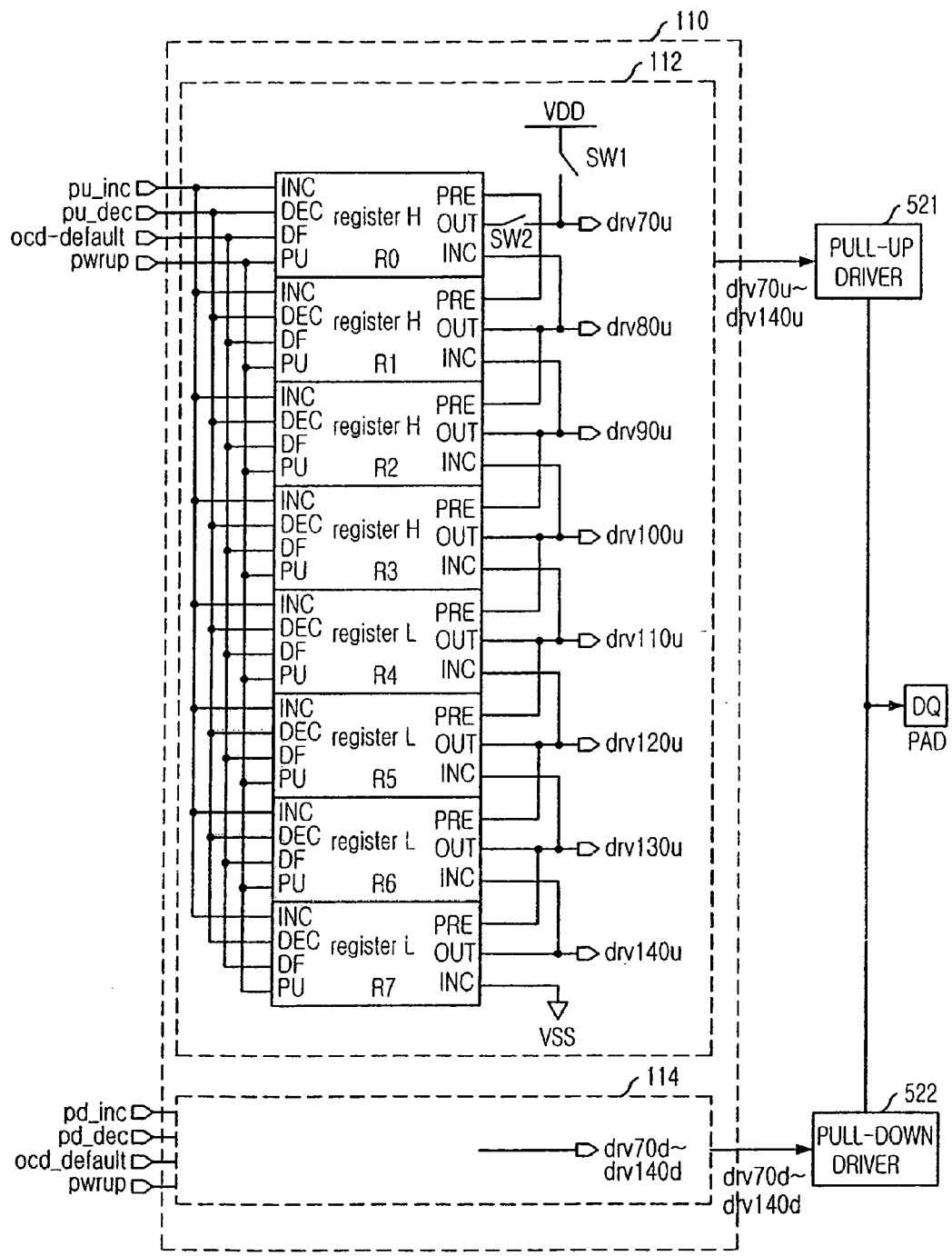
FIG. 14 is a block diagram showing an OCD control logic unit, a pull-up driver and a pull-down driver.

FIG. 14 is a block diagram showing the OCD control logic unit 110, a pull-up driver 521 and a pull-down driver 522. The pull-up driver 521 and the pull-down driver 522 are included in the data output driver 520. As shown, the OCD control logic unit 110 includes a pull-up OCD control logic unit 112 and a pull-down OCD control logic unit 114.

In detail, the pull-up OCD control logic unit 112 includes a first to a fourth initial-high registers R0 to R3 and a first to a fourth initial-low registers R4 to R7, each for generating a first to an eighth pull-up driver impedance adjustment signal drv70u to drv140u in response to the pull-up increase signal pu_inc and the pull-up decrease signal pu_dec respectively.

Likewise, the pull-down OCD control logic unit 114 includes four initial-high registers and four initial-low registers for generating a first to an eighth pull-down driver impedance adjustment signal drv70d to drv140d in response to the pull-down increase signal pd_inc and the pull-down decrease signal pd_dec. The structure and an operation of the pull-down OCD control logic unit 114 are the same as those of the pull-up OCD control logic unit 112. Therefore, detailed description of the pull-down OCD control logic unit 114 is omitted.

At an initial operation, the pull-up OCD control logic unit 112 activates and outputs predetermined pull-up driver impedance adjustment signals among the first to the eighth pull-up driver impedance adjustment signals drv70u to drv140u, e.g., the first to the fourth pull-up driver impedance adjustment signals drv70u to drv100u, in response to the OCD default control signal ocd_default. After that, the pull-up OCD control logic unit 112 controls the number of activated pull-up driver impedance adjustment signals among the first to the eighth pull-up driver impedance adjustment signals drv70u to drv140u in response to the pull-up increase signal pu_inc and the pull-up decrease signal pu_dec.

A power-up signal pwrup serves as an enable signal for the first to the fourth initial-high registers R0 to R3 and the first to the fourth initial-low register R4 to R7. A first switch SW1 and a second switch SW2 selects between an output signal of the first initial-high register R0 and a power supply voltage VDD, and outputs the selected signal as the first pull-up driver impedance adjustment signal drv70u.

At least, the first pull-up driver impedance adjustment signal drv70u among the first to the eighth pull-up driver impedance adjust signals drv70u to drv140u should be activated. Therefore, the second switch SW2 outputs the power voltage VDD to the drv70u to thereby always activate the drv70u.

Figure 15A:
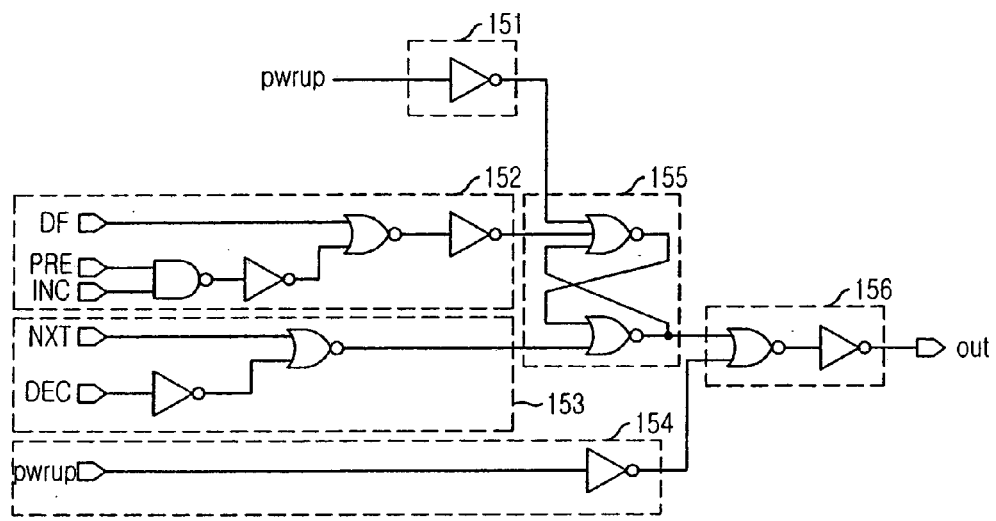
FIG. 15A is a schematic circuit diagram showing an initial-high register.

FIG. 15A is a schematic circuit diagram showing one of the first to the fourth initial-high registers R0 to R3 included in the pull-up OCD control logic unit 112. As shown, the third initial-high register R2 includes a first enable buffer unit 151, a second enable buffer unit 154, a first signal input unit 152, a second signal input unit 153, a first RS flip-flop unit 155 and a first signal output unit 156.

The first signal input unit 152 receives the OCD default control signal ocd_default, which is in a logic high level, through a default input terminal DF and output the OCD default control signal ocd_default after buffering the OCD default control signal ocd_default. The first signal input unit 152 also performs a logic operation on the pull-up increase signal pu_inc and an output signal of a previous initial-high register, i.e., of the second initial-high register R1 in this case, then, outputs the result of the logic operation.

The second signal input unit 153 performs a logic NOR operation on an inverted signal of the pull-up decrease signal pu_dec and an output signal of a next initial-high register, i.e., of the fourth initial-high register 154 in this case, then, output the result of the logic NOR operation.

The first RS flip-flop unit 155 receives output signal of the first and the second signal input units 152 and 153 as its input signals, and the first RS flip-flop unit 155 is enabled by the power-up signal pwrup. The first signal output unit 156 is enabled by the power-up signal pwrup and buffers an outputted signal of the first RS flip-flop unit 155 to thereby output the buffered signal as an output signal of the third initial-high register R2, i.e., the third pull-up driver impedance adjustment signal drv90u. The first and the second enable buffer units 151 and 154 serve to transfer the power-up signal pwrup to the first RS flip-flop unit 155 and the first signal output unit 156 respectively.

Figure 15B:
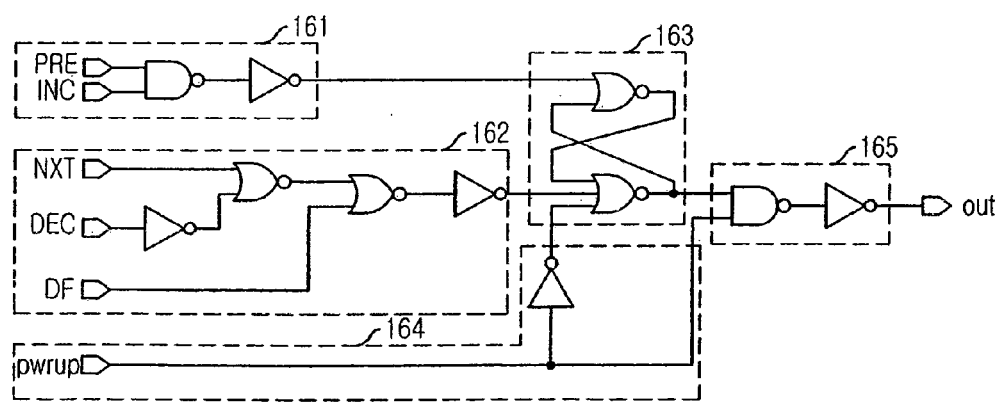
FIG. 15B is a schematic circuit diagram showing an initial-low register.

FIG. 15B is a schematic circuit diagram showing one of the first to the fourth initial-low registers included in the pull-up OCD control logic unit 112. As shown, the third initial-low register R6 includes a third signal input unit 161, a fourth signal input unit 162, a second RS flip-flop unit 163, a third enable buffer unit 164 and a second signal output unit 165.

The third signal input unit 161 performs a logic NAND operation on the pull-up increase signal pu_inc and an outputted signal from a previous register, i.e., from the second initial-low register R5 in this case; and, then, outputs the result of the logic NAND operation.

The fourth signal input unit 162 receives the OCD default control signal ocd_default through the default input terminal DF and output the OCD default control signal ocd_default after buffering the OCD default control signal ocd_default. The fourth signal input unit 162 also performs a logic NOR operation on an inverted signal of the pull-up decrease signal pu_dec and an outputted signal of a next register; and, then, outputs the result of the logic NOR operation.

The second RS flip-flop unit 163 is enabled by the power signal pwrup and receives outputted signals from the third and the fourth signal input units 161 and 162. The second signal output unit 165 is enabled by the power-up signal pwrup and buffers an outputted signal of the second RS flip-flop unit 163 to thereby output the buffered signal as an output signal of the third initial-low register 117, i.e., the seventh pull-up driver impedance adjustment signal drv130u.

Figure 16:
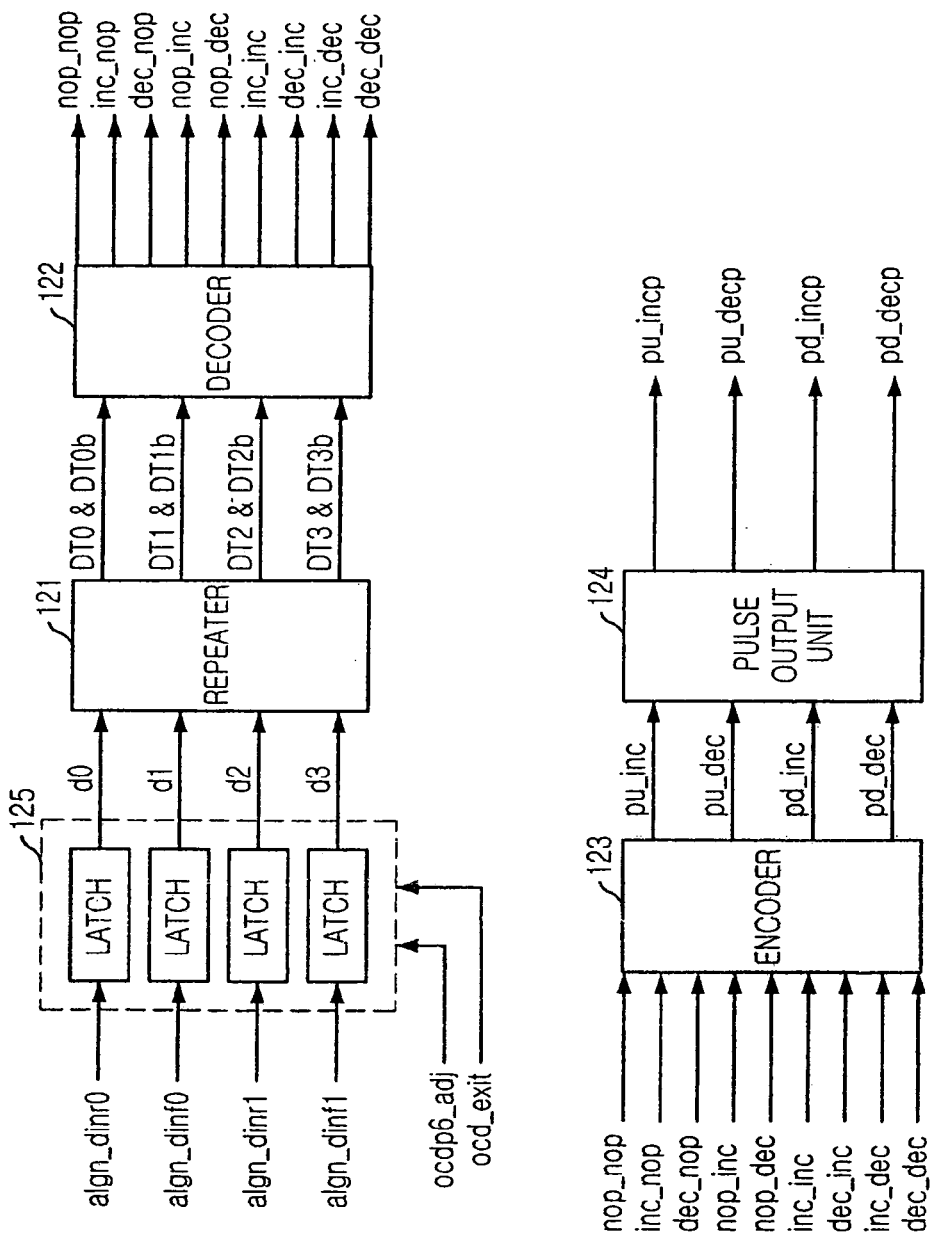
FIG. 16 is a block diagram showing an OCD command decoder shown in FIG. 5.

FIG. 16 is a block diagram showing the OCD command decoder 120 shown in FIG. 5. As shown, the OCD command decoder 120 includes a repeater 121, an OCD latch unit 125, a decoder 122, an OCD encoder 123, and a pulse output unit 124. The OCD latch unit 125 latches the aligned OCD control code, i.e., the plural single-bit data algn_dinr0, algn_dinr1, algn_dinf0 and algn_dinf1. The decoder 122 decodes the OCD control code latched by the OCD latch unit 125 for generating a plurality of OCD control signals, and the decoder 122 activates one of the plurality of OCD control signals. The OCD encoder 123 generates the pull-up increase signal pu_inc, the pull-up decrease signal pu_dec, the pull-down increase signal pd_inc and the pull-down decrease signal pd_dec based on the activated signal of the plurality of OCD control signals.

Figure 17:
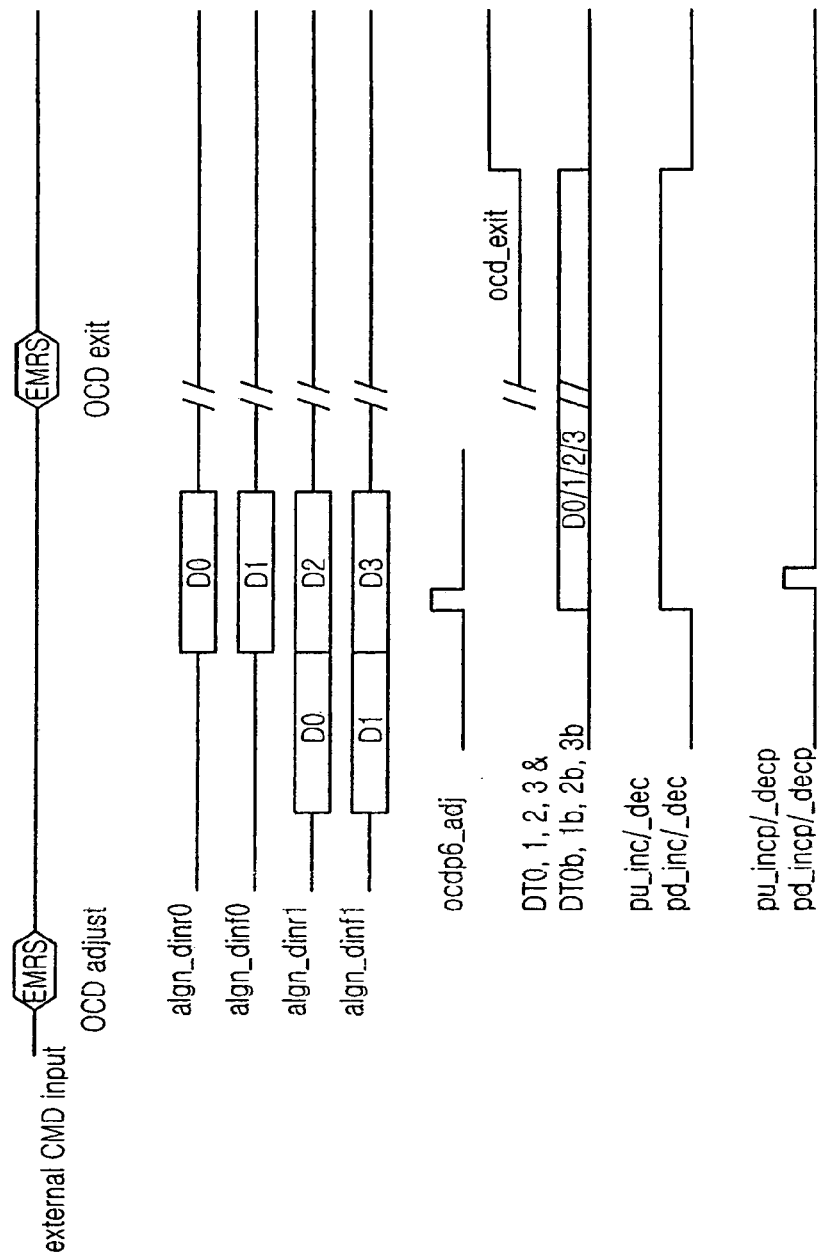
FIG. 17 is a timing diagram showing an operation of an OCD command decoder shown in FIG. 16.

FIG. 17 is a timing diagram showing an operation of the OCD command decoder 120 shown in FIG. 16. An operation of the semiconductor memory device in accordance with the present invention is described below referring to FIGS. 5 to 17. As described above, the OCD calibration control operation has been introduced by the JEDEC in order to increase an operational speed of a semiconductor memory device.

The OCD calibration control operation is performed for adjusting impedance of a data output driver so that the data output driver can have optimum impedance at a current system status. For this purpose, the impedance of the data output driver should be measured first, and, then, the impedance of the data output driver is adjusted so that the data output driver can have optimum impedance at a current system status while the OCD calibration control operation. Therefore, a semiconductor memory device should be provided with an OCD control code input pin, an OCD control code input unit and a control unit for adjusting impedance of the data output driver by decoding the OCD control code. However, as shown in FIG. 5, the semiconductor memory device in accordance with the present invention does not include a particular OCD control code input unit. Instead, the semiconductor memory device uses the data input unit 400 as the OCD control code input unit.

The semiconductor memory device receives data through the data input unit 400 and transfers the received data to the memory core block 500 during the data access operation. During the OCD calibration control operation, the OCD control code is inputted to the data input unit 400 so that the OCD control code can be decoded for adjusting impedance of the data output driver 520. Particularly, the semiconductor memory device generates the OCD operation signal ocdp6_adj using the CAS signal generator 200. Therefore, the CAS signal generator 200 is provided with the OCD mode entrance signal input unit 211.

After impedance of the data output driver 520 is adjusted to have optimum impedance, the data output driver 520 outputs the data through a data input/output pin (DQ pad). At this time, since impedance of the data output driver 520 is optimum for a current system status, the data can be outputted stable at a high speed. As described above, the OCD calibration control operation can be divided into two sequences, i.e., a first sequence for measuring impedance of the data output driver 520 and a second sequence for adjusting the impedance.

The EMRS decoder 700 decodes the OCD control signal through the 3-bit address pin add<7:9> for indicating that the semiconductor memory device is in a mode for performing the OCD calibration control operation. If the OCD control signal inputted to the 3-bit address pin add<7:9> is '100', the EMRS decoder 700 activates the first drive mode signal ocd_drive1. An operation of the EMRS decoder 700 according the OCD control signal inputted to the 3-bit address pin add<7:9> is shown in FIG. 3B.

If the first drive mode ocd_drive1 is activated, the pull-up driver 521 outputs the data as a logic high level. At this time, impedance of the pull-up driver 521 is measured by a chipset. Thereafter, if the OCD control signal is inputted as '001' through the 3-bit address pin add<7:9>, the EMRS decoder 700 activates the OCD period signal ocd_adj. If the OCD period signal ocd_adj is activated, a 4-bit control code is sequentially inputted through the DQ pad. The 4-bit control code is aligned by the data input unit 400.

Then, the OCD command decoder 120 decodes the aligned 4-bit control code in order to generate the pull-up increase signal pu_inc, the pull-up decrease signal pu_dec, the pull-down increase signal pd_inc and the pull-down decrease signal pd_dec. Thereafter, the OCD control logic unit 110 generates the first to the eighth pull-up driver impedance adjustment signal drv70u to drv140u in response to the pull-up increase signal pu_inc and the pull-up decrease signal pu_dec.

Thereafter, impedance of the pull-up driver 521 is adjusted based on the first to the eighth pull-up driver impedance adjustment signal drv70u to drv140u. The impedance of the pull-up driver is adjusted by controlling the number of turned-on MOS transistors among the whole MOS transistors included in the pull-up driver 521. During outputting the data as a high level, impedance of the pull-up driver 521 is set to the adjusted impedance. Meanwhile, an operation for adjusting impedance of the pull-down driver 522 is performed by the same way described above.

As described above, the semiconductor memory device in accordance with the present invention decodes the OCD control code without employing additional input/output pins and an OCD control code input unit. Therefore, the semiconductor memory device in accordance with the present invention can perform the OCD calibration control operation minimizing a size of additional circuits for the OCD calibration control operation.

The present application contains subject matter related to Korean patent application No. 2004-32845, filed in the Korean Patent Office on May 10, 2004, the entire contents of which being incorporated herein by reference. While the present invention has been described with respect to the particular embodiments, it will be apparent to those skilled in the art that various changes and modifications may be made without departing from the spirit and scope of the invention as defined in the following claims.

What is claimed is:

1. A semiconductor memory device for performing an off chip driver (OCD) calibration control operation to adjust a data output impedance comprising:

a decoder configured to generate an OCD default control signal, an OCD operation signal, and plural data in response to a column address strobe (CAS) signal, and a result of decoding an address signal;

a code generator for receiving plural-bit data to generate an OCD control code;

a first circuit for receiving the OCD control code and the OCD operation signal to generate a plurality of impedance adjustment control signals; and a second circuit for receiving the plural-bit data and adjusting the data output impedance in response to the plurality of impedance adjustment control signals, wherein the decoder includes an extended mode register set (EMRS) decoder for decoding the address signal to generate an OCD period signal and a CAS signal generator for outputting the OCD operation signal to the first circuit for receiving the OCD control code in response to the OCD period signal.

2. The semiconductor memory device as recited in claim 1, wherein the EMRS decoder decodes the address signal to generate an OCD default control signal, a first drive mode signal, a second drive mode signal, an OCD exit signal and the OCD period signal.

3. The semiconductor memory device as recited in claim 2, wherein the decoder further includes:
an OCD control signal input unit for receiving the address signal to generate an OCD mode entrance signal; and
a CAS signal generator for outputting the OCD operation signal to the first circuit in response to the OCD period signal, the OCD mode entrance signal, a row address strobe (RAS) signal, the CAS signal, the write enable signal, and a chip selection signal.

4. The semiconductor memory device as recited in claim 3, wherein the CAS signal generator includes:
a first CAS signal generator enabled by the OCD mode entrance signal to generate a first step CAS signal;
a second CAS signal generator for generating a second step CAS signal by delaying the first step CAS signal for a predetermined delay time; and
a third CAS signal generator for outputting the second step CAS signal as the OCD operation signal in response to the OCD mode entrance signal.

5. The semiconductor memory device as recited in claim 4, wherein the first CAS signal generator includes:
a read/write control signal input unit for activating a first signal;
an OCD signal input unit for activating the first signal during the OCD calibration control operation; and
a CAS signal transferring unit for latching the first signal of the first node and outputting the first signal of the first node as the first step CAS signal in response to a clock signal.

6. The semiconductor memory device as recited in claim 5, wherein the CAS signal transferring unit includes:
a signal input unit for transferring the first step CAS signal to a second node when the first signal of the first node is activated;
a first latch unit for latching a second signal of the second node;
a transferring gate for transferring the second signal of the second node latched by the first latch unit in response to the clock signal;
a second latch unit for latching an outputted signal of the transferring gate;
a first flip-flop shifter for shifting an outputted signal of the second latch unit according to an additive latency signal; and
a second flip-flop shifter for shifting an outputted signal of the first flip-flop shifter according to a CAS latency signal to thereby output the first step CAS signal.

7. The semiconductor memory device as recited in claim 4, wherein the second CAS signal generator includes:
a signal input unit for receiving the first step CAS signal;
a first latch unit for latching an outputted signal of the signal input unit;
a transferring gate for transferring an outputted signal of the first latch unit in response to a clock signal;
a delay unit for delaying an outputted signal of the transferring gate for one clock cycle; and
a second latch unit for outputting an outputted signal of the delay unit as the second step CAS signal.

8. The semiconductor memory device as recited in claim 4, wherein the third CAS signal generator includes:

a signal input unit for receiving the second step CAS signal;
a first signal output unit for outputting an outputted signal of the signal input unit as the OCD operation signal when the OCD period signal is activated; and
a second signal output unit for outputting the outputted signal of the signal input unit as the CAS signal when the OCD period signal is inactivated.

9. The semiconductor memory device as recited in claim 8, wherein the second circuit generates the OCD control code aligning the plural-bit data when the semiconductor memory device is in an OCD calibration control mode.

10. The semiconductor memory device as recited in claim 9, wherein the first circuit includes:
an OCD command decoder for decoding the OCD control code and the OCD operation signal for generating a pull-up increase signal, a pull-up decrease signal, a pull-down increase signal and a pull-down decrease signal; and
an OCD control logic unit for generating the plurality of impedance adjustment control signals based on the OCD default signal, the pull-up increase signal, the pull-up decrease signal, the pull-down increase signal and the pull-down decrease signal.

11. The semiconductor memory device as recited in claim 10, wherein the OCD control logic unit includes:
a pull-up OCD control logic unit for receiving the OCD default control signal, the pull-up increase signal, the pull-up decrease signal and a power-up signal to generate a plurality of pull-up impedance adjustment control signals; and
a pull-down OCD control logic unit for receiving the OCD default control signal, the pull-down increase signal, the pull-down decrease signal and a power-up signal to generate a plurality of pull-down impedance adjustment control signals,
wherein, the plurality of impedance adjustment control signals include the plurality of pull-up impedance adjustment control signals and the plurality of pull-down impedance adjustment control signals.

12. The semiconductor memory device as recited in claim 11, wherein the pull-up OCD control logic unit includes:
a plurality of initial-high registers and a plurality of initial-low registers for receiving the OCD default control signal, the pull-up increase signal, the pull-up decrease signal and a power-up signal to generate the plurality of pull-up impedance adjustment control signals.

13. The semiconductor memory device as recited in claim 12, wherein each of the plurality of initial-high registers includes:
a first enable buffer unit and a second enable buffer unit for receiving the power-up signal;
a first signal input unit for receiving the OCD default control signal, the pull-up increase signal and an output signal of a previous initial-high register;
a second signal input unit for receiving the pull-up decrease signal;
an RS flip-flop unit for receiving output signals of the first signal input unit and the second signal input unit; and
a signal output unit for receiving an output signal of the first RS flip-flop unit to generate one of the pull-up impedance adjustment control signals.

14. The semiconductor memory device as recited in claim 12, wherein each of the plurality of initial-low registers includes:

an enable buffer unit for receiving the power up signal;

a first signal input unit for receiving the pull-up increase signal and an output signal of a previous initial-low register;

a second signal input unit for receiving the pull-up decrease signal and the OCD default control signal;

an RS flip-flop unit for receiving output signals of the first signal input unit and the second signal input unit; and a signal output unit for receiving an output signal of the first RS flip-flop unit to generate one of the pull-up impedance adjustment control signals.

15. The semiconductor memory device as recited in claim 11, wherein the pull-up OCD control logic unit includes:

a plurality of initial-high registers and a plurality of initial-low registers for receiving the OCD default control signal, the pull-up increase signal, the pull-up decrease signal and a power-up signal to generate the plurality of pull-up impedance adjustment control signals.

16. The semiconductor memory device as recited in claim 15, wherein each of the plurality of initial-high registers includes:

a first enable buffer unit and a second enable buffer unit for receiving the power-up signal;

a first signal input unit for receiving the OCD default control signal, the pull-up increase signal and an output signal of a previous initial-high register;

a second signal input unit for receiving the pull-up decrease signal;

an RS flip-flop unit for receiving output signals of the first signal input unit and the second signal input unit; and a signal output unit for receiving an output signal of the first RS flip-flop unit to generate one of the pull-up impedance adjustment control signals.

17. The semiconductor memory device as recited in claim 15, wherein each of the plurality of initial-low registers includes:

an enable buffer unit for receiving the power up signal;

a first signal input unit for receiving the pull-up increase signal and an output signal of a previous initial-low register;

a second signal input unit for receiving the pull-up decrease signal and the OCD default control signal;

an RS flip-flop unit for receiving output signals of the first signal input unit and the second signal input unit; and a signal output unit for receiving an output signal of the first RS flip-flop unit to generate one of the pull-up impedance adjustment control signal.

* * * * *